United States Patent
Su et al.

(10) Patent No.: US 7,943,490 B2
(45) Date of Patent: May 17, 2011

(54) METHOD OF CUTTING PCBS

(75) Inventors: Ying Su, Shenzhen (CN); Hu-Hai Zhang, Shenzhen (CN); Huan-Long Lin, Tayuan (TW)

(73) Assignees: FuKui Precision Compenent(Shenzhen) Co., Ltd., Shenzhen, Guangdong Province (CN); Foxconn Advanced Technology Inc., Tayuan, Taoyuan (TW)

(*) Notice: Subject to any disclaimer, the term of this patent is extended or adjusted under 35 U.S.C. 154(b) by 515 days.

(21) Appl. No.: 12/051,687

(22) Filed: Mar. 19, 2008

(65) Prior Publication Data
US 2009/0042370 A1  Feb. 12, 2009

(30) Foreign Application Priority Data
Aug. 10, 2007  (CN) .......................... 2007 1 0075667

(51) Int. Cl.
*H01L 21/46* (2006.01)

(52) U.S. Cl. .......................... 438/463; 438/460; 438/465

(58) Field of Classification Search .................. 438/458, 438/460, 463, 464, 465
See application file for complete search history.

(56) References Cited

U.S. PATENT DOCUMENTS

| | | | |
|---|---|---|---|
| 5,609,746 A * | 3/1997 | Farrar et al. ..................... 216/13 |
| 7,742,843 B2 * | 6/2010 | Licht et al. ..................... 257/703 |
| 2003/0160035 A1 * | 8/2003 | Gregory .................. 219/121.69 |
| 2004/0142191 A1 * | 7/2004 | Mei-Yen et al. ........... 428/473.5 |
| 2008/0026602 A1 * | 1/2008 | Wang et al. ..................... 439/59 |

* cited by examiner

*Primary Examiner* — Kevin M Picardat
(74) *Attorney, Agent, or Firm* — Andrew C. Cheng

(57) ABSTRACT

The present invention relates to a method of cutting PCB module using a laser. The method includes steps of: providing a coverlay film, the coverlay film including at least one opening defined therein; attaching the coverlay film onto the PCB module such that the through holes of the PCB module are covered by the coverlay film and the laser cutting area thereof is exposed via the at least one opening; applying a laser beam to the exposed laser cutting area of the PCB module to cut the PCB module; and removing the coverlay film. A high positioning precision of the PCB module and better cutting result can be obtained.

15 Claims, 3 Drawing Sheets

METHOD OF CUTTING PCBS

BACKGROUND

1. Technical Field

The present invention relate to method of cutting printed circuit boards (PCBs) and, specifically, relate to a method of cutting PCBs using a laser.

2. Discussion of Related Art

Recently, as the electronic appliances are becoming smaller in size and diversified in shape, PCBs used in such electronic appliances are required to have high circuit density and various shapes.

Generally, PCBs are fabricated using copper clad laminates (CCLs). Usually, CCLs are larger than the PCBs to be fabricated. In order to improve a usage percentage of CCLs, two or more PCBs are fabricated using one CCL simultaneously.

After the fabrication step is finished, for example, all the conductive traces and conductive holes are formed; the PCBs must be cut from the CCL to prepare for the next process. CCL can be cut using a stamping method or a laser ablation method. Stamping method has a higher efficiency than laser ablation method while laser ablation method has a higher precision than stamping method.

A laser cutting system usually includes a vacuum system for capturing workpiece such as CCLs. However, PCBs usually includes through holes configured for allowing air to pass therethrough into the vacuum system when PCBs are captured using the vacuum system. As a result, air pressure in the vacuum system will be reduced and CCLs may move relative to the vacuum system, and laser may cut at wrong sections of the PCBs thus damaging the PCBs.

Therefore, there is a desire to develop a method of cutting PCBs using a laser having high precision.

SUMMARY

In one embodiment, the method includes steps of: providing a coverlay film, the coverlay film including at least one opening defined therein; attaching the coverlay film onto the PCB module such that the through holes of the PCB module are covered by the coverlay film and the laser cutting area thereof is exposed via the at least one opening; applying a laser beam to the exposed laser cutting area of the PCB module to cut the PCB module; and removing the coverlay film.

This and other features and advantages of the present invention as well as the preferred embodiments thereof and a method of cutting PCBs in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 2:
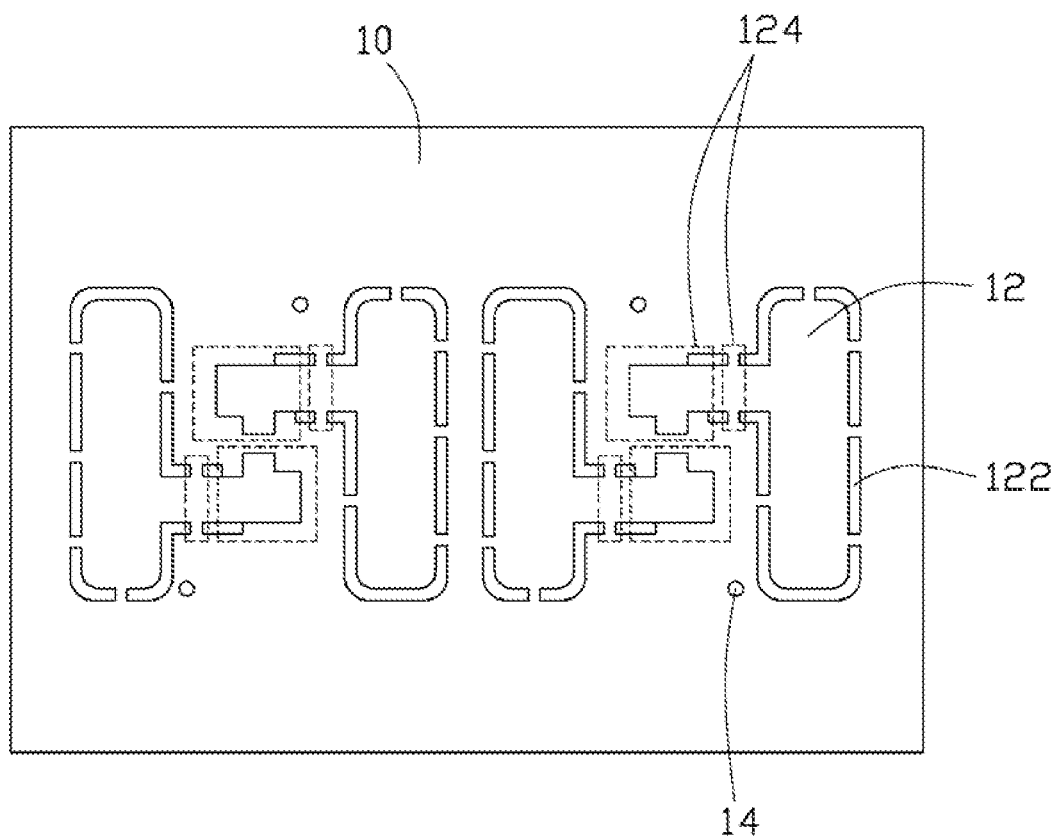
FIG. 2 illustrates a PCB module including several PCB units therein.

FIG. 2 illustrates a PCB module 10, which is a base board, includes a number of PCB units waiting to be separated. Each of the PCB units has constructed traces, through holes, and other predetermined configurations (not shown). In the present embodiment, the PCB module 10 includes four PCB units 12 and four positioning marks 14 separated from the four PCB units 12. The PCB units 12 are spacedly arranged, and the positioning marks 14 are adjacent to the PCB units 12. Boundary holes 122 are formed along a boundary of each PCB unit 12 by a stamping method. Each of the PCB units 12 defines two laser-cutting areas 124. A boundary of each of the PCB units 12 in the laser-cutting areas 124 must be cut using a laser. It is to be understood that structure of PCB module 10 may vary. For instance, the number of the PCB units 12 and the number of the positioning marks 14 may be different from each other. Positioning marks 14 can be through holes formed in the print circuit board module 10.

Figure 1:
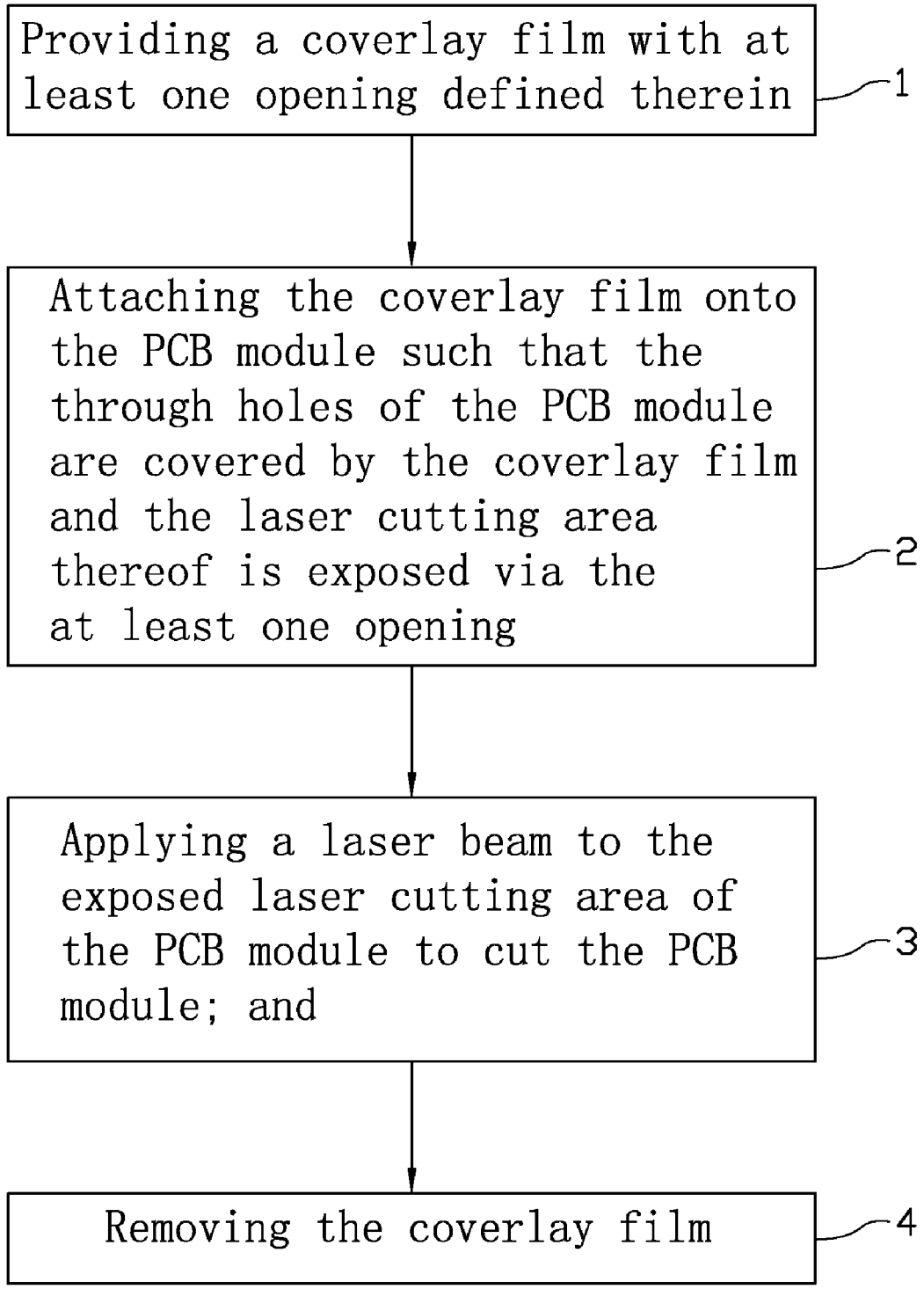
FIG. 1 illustrates a method of cutting a PCB module using a laser.
Figure 3:
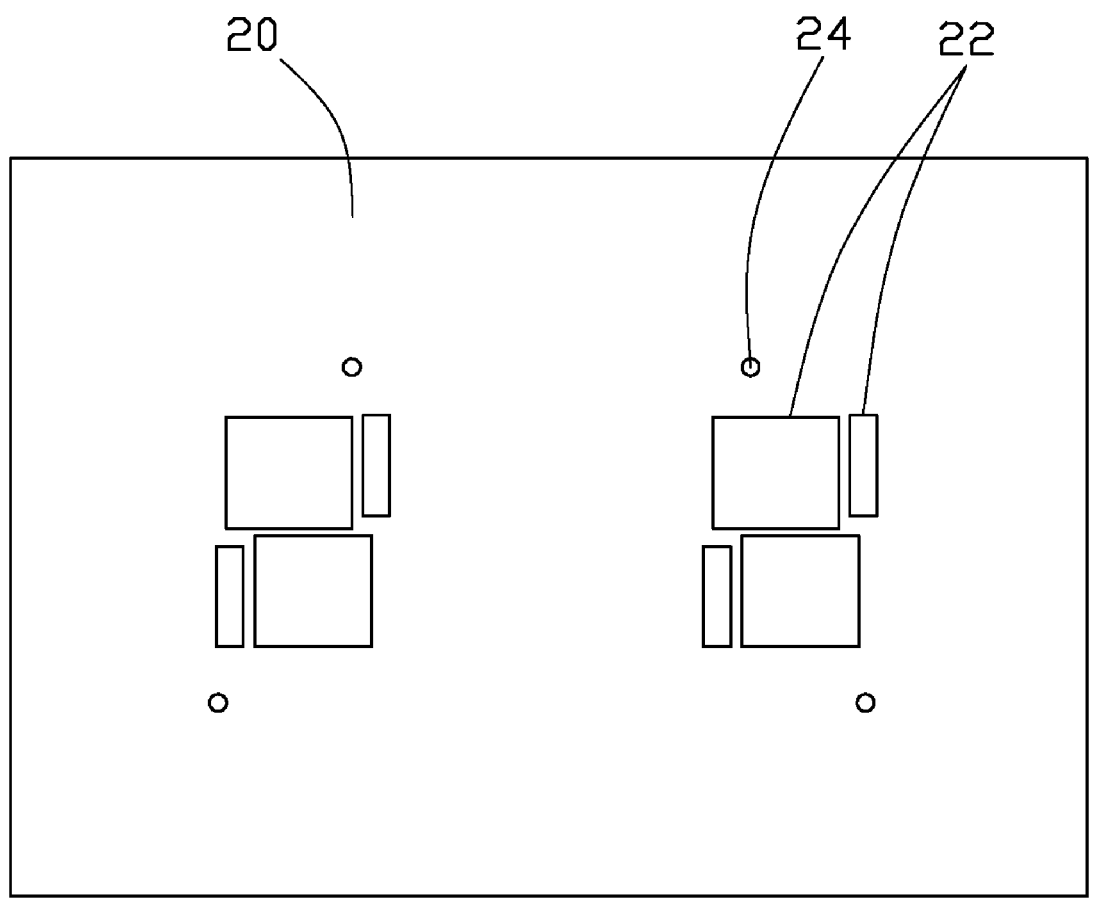
FIG. 3 illustrates a coverlay film used in the method of FIG. 1.

FIG. 1 illustrates a method of cutting the PCB module 10, the method will be described in detail as following:

In step 1, referring to FIG. 3, a coverlay film 20 is provided. The coverlay film 20 includes a number of openings 22 defined therein. Each of the openings 22 corresponds to a laser-cutting area 124 in the PCB module 10. Preferably, a shape and a size of each opening 22 are equal to those of the corresponding laser-cutting area 124. In this embodiment, the coverlay film 20 includes four positioning holes 24 defined therein. Each positioning hole 24 corresponds to a positioning mark 14 in the PCB module 10.

The coverlay film 20 can be made from a plastic film, preferably made of transparent materials. Examples of the transparent plastic film include polyethylene and polypropylene films. The openings 22 and the positioning holes 24 can be formed using a stamping method or a laser ablation method. The positioning holes 24 are configured for exposing the positioning marks 14 to the outside such that the positioning marks 14 can be easily detected. It is to be understood that if the coverlay film 20 is transparent, the positioning marks 14 can also be easily detected if no positioning holes 24 are formed in the coverlay film 20.

In Step 2, the coverlay film 20 is attached onto a surface of the PCB module 10 and the openings 22 are respectively aligned with the laser-cutting areas 124. Thus, the through holes of the PCB module 10 are covered by the coverlay film 20, the laser-cutting areas 124 are exposed in the openings 22, and the positioning marks 14 are exposed to the outside via the positioning holes 24.

The coverlay film 20 can be placed and laminated onto a surface of the PCB module 10 manually or using an automatic laminator. No gap exists between the coverlay film 20 and the PCB module 10; therefore, the coverlay film 20 is tightly attached to the PCB module 10 due to the ambient air pressure. Preferably, different types of electric charge can be applied onto the PCB module 10 and the coverlay film 20 respectively. Different electric charges attract the PCB module 10 and the coverlay film 20 with each other.

In step 3, a laser beam is applied onto the laser-cutting area 124 in the PCB module 10 so as to cut the PCB module 10. A laser cutting system, for example, a carbon oxide laser cutting system, a Nd:YAG laser cutting system, or an excimer laser cutting system, can be used in this step. Generally, the laser cutting system uses one or more vacuum suction mechanism for suctioning/absorbing the PCB module 10. In this embodiment, the coverlay film 20 is attached on a surface of the PCB module 10 and covers the through holes of the PCB module 10; therefore, the vacuum suction mechanism absorbs the coverlay film 20, as a result, the ambient air cannot enter the vacuum suction mechanism. The suction of the vacuum suction mechanism is maintained at a high level. The coverlay film 20 and the PCB module 10 are tightly absorbed/suctioned by the vacuum suction mechanism. The laser cutting system can use a mark-identifying device, for example, a charged couple device (CCD) camera, to obtain the position of the positioning marks 14, and then the laser cutting system can be used to cut the laser-cutting areas 124 using the positioning marks 14 as a positioning reference.

In step 4, the coverlay film 20 is removed so as to obtain the PCB units 12. After the laser cutting step is finished, the coverlay film 20 can be striped and the PCB units 12 can be separated from the PCB module 10.

In the present method of cutting the PCB module 10 into a number of the separated PCB units 12, a coverlay film 20 is used to prevent ambient air from going into the vacuum system; the suctioning/vacuum pressure of the vacuum suction mechanism is maintained at a high level. The PCB module 10 is tightly suctioned and thereby held, and thus a high precision cutting result can be obtained.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method of cutting a printed circuit board (PCB) module, the PCB module having a laser cutting area and a plurality of through holes, the method comprising:
    providing a coverlay film with at least one opening defined therein;
    attaching the coverlay film onto the PCB module such that the through holes of the PCB module are covered by the coverlay film and the laser cutting area thereof is exposed via the at least one opening;
    holding the PCB module using a vacuum suction device and applying a laser beam to the exposed laser cutting area of the PCB module to cut the PCB module; and
    removing the coverlay film.

2. The method of cutting a PCB module as claimed in claim 1, wherein the coverlay film is a transparent plastic film.

3. The method of cutting a PCB module as claimed in claim 2, wherein the coverlay film is comprised of a material selected from the group consisting of polyethylene and polypropylene.

4. The method of cutting a PCB module as claimed in claim 1, wherein the PCB module defines a plurality of first positioning holes, and the method further comprises a step of forming a plurality of corresponding second positioning holes in the coverlay film.

5. The method of cutting a PCB module as claimed in claim 4, wherein the first positioning holes are exposed to the outside via the corresponding second positioning holes in the step of attaching the coverlay film onto the PCB module, and a mark-identifying device is used to obtain the position of the first positioning holes as a positioning reference in the step of applying a laser beam to the exposed laser cutting area of the PCB module.

6. The method of cutting a PCB module as claimed in claim 1, wherein the PCB module defines a plurality of positioning marks, the coverlay film is transparent, and, when the laser beam is applied to the exposed laser cutting area of the PCB module to cut the PCB module, a mark-identifying device is used to obtain the position of the positioning marks as a positioning reference.

7. A method of cutting a PCB module, the PCB module having a plurality of laser cutting areas and a plurality of through holes, the method comprising:
    providing a transparent coverlay film with a plurality of openings defined therein, each of the openings corresponding to one of the laser cutting areas;
    attaching the coverlay film onto the PCB module such that the through holes of the PCB module are covered by the coverlay film and the laser cutting areas are exposed in the corresponding openings;
    holding the PCB module using a vacuum suction device without entering of ambient air and applying a laser beam to the exposed laser cutting area of the PCB module to cut the PCB module; and
    removing the coverlay film.

8. The method as claimed in claim 7, wherein the PCB module defines a plurality of positioning marks, a mark-identifying device is used to obtain the position of the positioning marks as a positioning reference in the step of applying a laser beam to the exposed laser cutting area of the PCB module.

9. The method as claimed in claim 8, wherein the mark-identifying device is a charge couple device camera.

10. A method of cutting a PCB module, the PCB module including a number of PCB units, each of which defines a laser cutting area and a plurality of through holes, with boundary holes being formed along a boundary of each of the PCB units, the method comprising:
    providing a coverlay film with a plurality of opening defined therein, the openings each corresponding to a laser cutting area of the PCB module;
    attaching the coverlay film onto a surface of the PCB module such that the through holes of the PCB module are covered by the coverlay film and the laser cutting area of each of the PCB units is aligned and exposed in a corresponding opening;
    using a laser cutting system to hold the PCB module with a vacuum suction device and to apply a laser beam to the exposed laser cutting areas of the PCB module to cut the PCB module, wherein no ambient air enters the vacuum suction device; and
    removing the coverlay film and separating the PCB units from the PCB module.

11. The method as claimed in claim 10, wherein the coverlay film is transparent, the PCB module defines a plurality of positioning marks, and the laser cutting system uses the positioning marks as a positioning reference in the step of cutting the PCB module.

12. The method as claimed in claim 11, wherein a mark-identifying device is used to obtain the position of the positioning marks.

13. The method as claimed in claim 12, wherein the mark-identifying device is a charge couple device camera.

14. The method as claimed in claim 10, wherein the PCB module defines a plurality of positioning marks, the coverlay film has a plurality of positioning holes defined therein, each positioning hole corresponds to a positioning mark of the PCB module, the positioning marks are exposed to the outside via the positioning holes in the step of attaching the coverlay film onto a surface of the PCB module, and the laser cutting system uses the positioning marks as a positioning reference in the step of cutting the PCB module.

15. The method of cutting PCB module as claimed in claim 14, wherein a charge couple device camera is used to obtain the position of the positioning marks.

* * * * *